(12) United States Patent
Tanabe et al.

(10) Patent No.: US 6,733,880 B2
(45) Date of Patent: May 11, 2004

(54) ADHESIVE FILM FOR SEMICONDUCTOR, LEAD FRAME WITH ADHESIVE FILM FOR SEMICONDUCTOR AND SEMICONDUCTOR DEVICE USING THE SAME

(75) Inventors: Yoshiyuki Tanabe, Ichihara (JP); Hidekazu Matsuura, Ichihara (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/149,401
(22) PCT Filed: Jan. 18, 2001
(86) PCT No.: PCT/JP01/00299
§ 371 (c)(1), (2), (4) Date: Jun. 11, 2002
(87) PCT Pub. No.: WO01/55277
PCT Pub. Date: Feb. 8, 2001

(65) Prior Publication Data
US 2003/0062630 A1 Apr. 3, 2003

(30) Foreign Application Priority Data
Jan. 19, 2000 (JP) .......................................... 2000-13995

(51) Int. Cl.$^7$ ................................................. B32B 7/12
(52) U.S. Cl. ................ 428/355 R; 428/412; 428/437.5; 428/474.5; 428/354; 428/355 EP; 428/407; 525/481; 528/87; 257/783
(58) Field of Search ............................ 428/412, 473.5, 428/474.5, 354, 355 R, 355 EP, 355 EN, 407; 525/481; 528/87; 257/783

(56) References Cited

U.S. PATENT DOCUMENTS

| 5,900,468 | A | 5/1999 | Miura et al. |
| 5,932,351 | A | 8/1999 | Shinada et al. |
| 6,265,782 | B1 * | 7/2001 | Yamamoto et al. .......... 257/783 |

FOREIGN PATENT DOCUMENTS

| EP | 839868 | 5/1998 | |
| JP | 58-198526 | 11/1983 | |
| JP | 1-313519 | 12/1989 | |
| JP | 11209729 | * 8/1999 | .......... C09J/163/00 |
| JP | 11-261240 | 9/1999 | |

* cited by examiner

Primary Examiner—Deborah Jones
Assistant Examiner—Ling X Xu
(74) Attorney, Agent, or Firm—Antonelli, Terry, Stout & Kraus, LLP

(57) ABSTRACT

An adhesive film for semiconductor, which has a three-layer structure consisting of a support film having each face coated with an adhesive layer, each adhesive layer containing (A) a heat resistant thermoplastic resin having a glass transition temperature of 130 to 300° C., a water absorption of 3% by weight or less and a squeeze length of 2 mm or less, (B) an epoxy resin and (C) a trisphenol compound as an epoxy resin-curing agent; a lead frame with adhesive film; and a semiconductor device wherein the lead frame with adhesive film is bonded to a semiconductor element.

25 Claims, 1 Drawing Sheet

ADHESIVE FILM FOR SEMICONDUCTOR, LEAD FRAME WITH ADHESIVE FILM FOR SEMICONDUCTOR AND SEMICONDUCTOR DEVICE USING THE SAME

TECHNICAL FIELD

This invention relates to an adhesive film for semiconductor, a lead frame with adhesive film for semiconductor and a semiconductor device using the same.

BACKGROUND ART

Despite recent enlargement of semiconductor chips because of increases in functions and storage capacity, the packages housing them need small external shapes due to restrictions in designs of printed wiring boards and demands for downsized electronic apparatuses. To meet such tendency, there have been proposed some new mounting systems applicable both for semiconductor chips of increased density and for high-density mounting. Particularly, LOC structures proposed for memory elements, wherein leads are bonded on chips, can improve efficiency in interconnection of chips and wire bonding and shorten interconnecting lines, thereby speeding up signal transmission and downsizing packages.

In the new mounting system, bonding interfaces exist between different materials, such as semiconductor chips and lead frames, and their bonding reliability strongly influences the reliability of semiconductor packages. Not to mention to bonding workability and reliability tolerable to the processing temperatures during packaging, such bonding reliability as to tolerate to moisture absorption and wet heat and prevent package cracking during solder reflow for mounting on substrates is a matter of importance.

Paste adhesives or adhesives applied to heat resistant base materials have been used for bonding them. An example is a hot-melt type adhesive film using polyimide resins (Japanese Patent Application Non-examined Publication Nos. 5-105850 (1993), 5-112760 (1993) and 5-112761 (1993)). However, bonding with hot-melt type adhesives needs very high temperatures due to the high Tg of the adhesive resins, and tends to thermally damage semiconductor chips and adherents, particularly copper lead frames. Lowering the Tg gives adhesive films having low temperature adhesive property, but causes the problem of package cracking because the adhesive resins having lowered heat resistance reliability and increased elasticity cannot relieve the heat stress applied between chips and lead frames by the heat history during solder reflow for mounting on substrates.

DISCLOSURE OF INVENTION

This invention provides an adhesive film for semiconductor, which can be bonded at low temperatures in semiconductor devices.

This invention further provides a lead frame with adhesive film for semiconductor produced by punching the adhesive film for semiconductor to stick it to a prescribed position of a lead frame.

This invention further provides an extremely reliable semiconductor device containing a lead frame and a semiconductor element bonded together by the adhesive film for semiconductor.

The inventors of this invention have tried to develop adhesive films for semiconductor satisfying both low temperature adhesive property and reflow cracking resistance of semiconductor devices, with the result that they have found that the above-described problems can be solved by forming adhesive layers from an adhesive, which contains a heat resistant thermoplastic resin having specific properties, an epoxy resin and a trisphenol compounds as an epoxy resin-curing agent, and completed this invention.

Accordingly, this invention relates to an adhesive film for semiconductor (the adhesive film of the first invention), which has a three-layer structure consisting of a support film having each face coated with an adhesive layer, each adhesive layer containing (A) a heat resistant thermoplastic resin having a glass transition temperature of 130 to 300° C., a water absorption of 3% by weight or less and a squeeze length of 2 mm or less, (B) an epoxy resin and (C) a trisphenol compound as an epoxy resin-curing agent.

This invention further relates to an adhesive film for semiconductor (the adhesive film of the second invention), which has a three-layer structure consisting of a support film having each face coated with an adhesive layer, each adhesive layer containing (A) a heat resistant thermoplastic resin having a glass transition temperature of 130 to 300° C., (B) an epoxy resin and (C) a trisphenol compound as an epoxy resin-curing agent, wherein the adhesive film having the three-layer structure has a water absorption of 3% by weight or less and a squeeze length of 2 mm or less.

This invention further relates to a lead frame with adhesive film for semiconductor, comprising a lead frame and the adhesive film for semiconductor stuck to the lead frame.

This invention further relates to a semiconductor device, containing a lead frame and a semiconductor element which are bonded to each other with the adhesive film for semiconductor.

BEST MODE FOR CARRYING OUT THE INVENTION

Figure 1:
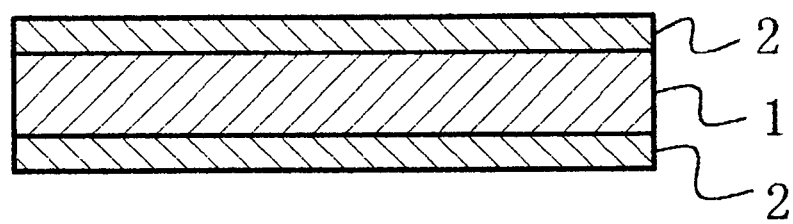
FIG. 1 is a sectional view of the adhesive film for semiconductor of this invention.

The heat resistant thermoplastic resin (A) to be used in the adhesive film of the first invention has a glass transition temperature of 130 to 300° C., a water absorption of 3% by weight or less and a squeeze length of 2 mm or less, and is therefore preferably a polyimide resin or a polyamide resin. Herein, the terms polyimide resins mean resins having imido groups, such as polyimide resins, polyamideimide resins, polyesterimide resins and polyetherimide resins.

If the glass transition temperature deviates from the above-described range, or the water absorption is more than 3% by weight, or the squeeze length is more than 2 mm, the semiconductor devices produced by using the adhesive film for semiconductor of this invention may have poor reflow cracking resistance.

The glass transition temperature of the heat resistant thermoplastic resin to be used in this invention is preferably 180 to 250° C. The water absorption is preferably 2.5% by weight or less, more preferably 2.0% by weight or less. The squeeze length is preferably 1 mm or less, more preferably 0.5 mm or less.

Herein, the water absorption of the heat resistant thermoplastic resin may be obtained by measuring the weight of a film of the heat resistant thermoplastic resin dried at 130° C. for one hour, immersing the dried film in distilled water of 25° C. for 24 hours and then measuring the weight of the film, and estimate water absorption from the following equation: {(weight after immersion−weight before immersion)/weight before immersion}×100(%). The squeeze length of the heat resistant thermoplastic resin is determined by pressing with heat a 19 mm×50 mm×25 μm thick film of a heat resistant thermoplastic resin at 350° C. under a pressure of 3 MPa for one minute, and measuring the length of the resin squeezed out perpendicularly from the center of the longer side of the original film.

The heat resistant thermoplastic resin (A) used in the adhesive film of the second invention has a glass transition temperature of 130 to 300° C. for the same reason as in the first invention. Also, the examples and preferred examples of the usable heat resistant thermoplastic resin (A) are the same as those for the first invention. The second invention prescribes that the adhesive film of the three-layer structure consisting of a support film having each face coated with an adhesive layer, not the heat resistant thermoplastic resin, has a water absorption of 3% by weight or less and a squeeze length of 2 mm or less. The preferable ranges thereof are the same as those for the first invention.

The water absorption of the adhesive film of the second invention may be obtained by the same method as that for the first invention except that the adhesive film of three-layer structure is used in place of the film of the heat resistant thermoplastic resin (A). The squeeze length of the adhesive film of the second invention may be obtained by cutting the adhesive film of three-layer structure instead of the heat resistant thermoplastic resin (A) into the same sizes (19 mm×50 mm), and conducting the same measurement as that for the first invention.

The adhesive film for semiconductor of the present invention preferably has both the characteristics defined in the first invention and the characteristics defined in the second invention.

Hereinafter, the adhesive film of the first invention, the adhesive film of the second invention, the lead frame with adhesive film for semiconductor and the semiconductor device using the same will be described.

The epoxy resin to be used in this invention may be any one having at least two epoxy groups per molecule. Examples are the compounds of the following formulae (1) to (3):

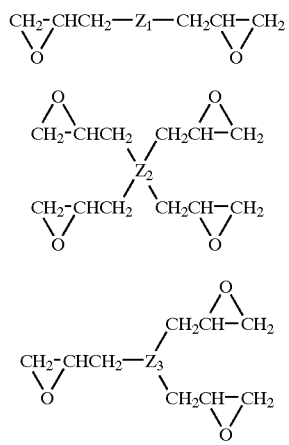

wherein $Z_1$ is a divalent organic group, $Z_2$ is a tetravalent organic group and $Z_3$ is a trivalent organic group.

Examples of the epoxy resins include bisphenol A diglycidyl ether, bisphenol F diglycidyl ether, bisphenol AD diglycidyl ether, bisphenol S diglycidyl ether, 2,6-xylenol diglycidyl ether, hydrogenated bisphenol A diglycidyl ether, 1,4-cyclohexane dimethanol diglycidyl ether, oxydiphenol diglycidyl ether, diglycidyl ethers of ethylene oxide-adduct of bisphenol A, diglycidyl ethers of propylene oxide-adduct of bisphenol A, polyethylene glycol diglycidyl ether, polypropylene glycol diglycidyl ether, neopentyl glycol diglycidyl ether, 1,6-hexanediol diglycidyl ether, glycidyl ethers of phenol novolak resins, glycidyl ethers of cresol novolak resins, glycidyl ethers of naphthalene resins, trifunctional glycidyl ethers, tetrafunctional glycidyl ethers, glycidyl ethers of dicyclopentadiene phenolic resins, glycidyl esters of dimer acids, trifunctional glycidylamines, tetrafunctional glycidylamines, glycidylamines of naphthalene resins, polysulfide-modified epoxy resins and polybutadiene-modified epoxy resins. They may contain monofunctional epoxides.

Preferred epoxy resins have an epoxy equivalent weight of 50 to 600, more preferably 150 to 500.

The epoxy resin-curing agent contained in the adhesive layers of this invention is a trisphenol compound having three hydroxyphenyl groups per molecule. Preferred examples of the trisphenol compounds are represented by the following general formula (a).

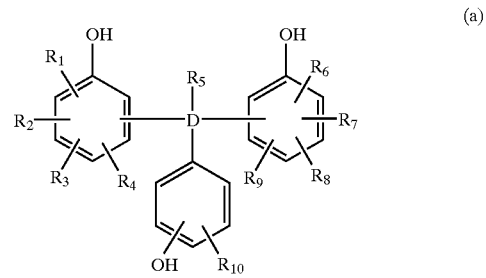

(a)

In formula (a), $R_1$ to $R_{10}$ are each independently hydrogen, an alkyl group of 1 to 10 carbon atoms, a cycloalkyl group of 5 to 10 carbon atoms, phenyl group or hydroxyl group. $R_5$ is preferably hydrogen, an alkyl group of 1 to 10 carbon atoms, a cycloalkyl group of 5 to 10 carbon atoms or phenyl group, more preferably hydrogen or an alkyl group of 1 to 10 carbon atoms. D is a tetravalent organic group. Examples of the tetravalent organic group D are as follows.

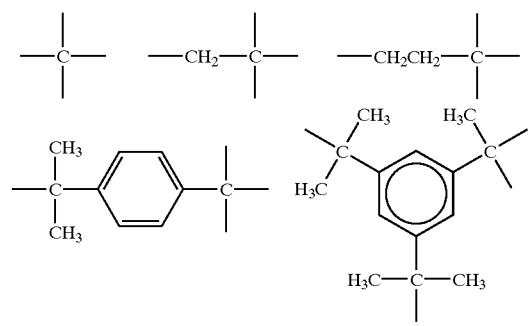

In general formula (a), preferred examples of ≡D—$R_5$ are as follows.

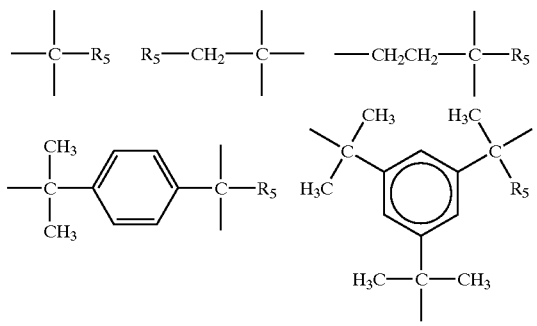

Examples of the trisphenol compounds include 4,4',4''-methylidenetrisphenol,4,4'-[1-[4-[1-(4-hydroxyphenyl)-1-methylethyl]phenyl]ethylidene]bisphenol,4,4',4''-ethylidinetris[2-methylphenol],4,4',4''-ethylidinetrisphenol, 4,4'-[(2-hydroxyphenyl)methylene]bis[2-methylphenol],4,4'-[(4-hydroxyphenyl)methylene]bis[2-methylphenol], 4,4'-[(2-hydroxyphenyl)methylene]bis[2,3-dimethylphenol],4,4'-[(4-hydroxyphenyl)methylene]bis[2,6-dimethylphenol], 4,4'-[(3-hydroxyphenyl)methylene]bis[2,3-dimethylphenol],2,2'-[(2-hydroxyphenyl)methylene]bis[3,5-dimethylphenol],2,2'-[(4-hydroxyphenyl)methylene]bis[3,5-dimethylphenol],4,4'-[(2-hydroxyphenyl)methylene]bis[2,3,5-trimethylphenol],4,4'-[(2-hydroxyphenyl)methylene]bis[2,3,6-trimethylphenyl],4,4'-[(3-hydroxyphenyl)methylene]bis[2,3,6-trimethylphenol],4,4'-[(4-hydroxyphenyl)methylene]bis[2,3,6-trimethylphenol],4,4'-[(2-hydroxyphenyl)methylene]bis[2-cyclohexyl-5-methylphenol], 4,4'-[(3-hydroxyphenyl)methylene]bis[2-cyclohexyl-5-methylphenol], 4,4'-[(4-hydroxyphenyl)methylene]bis[2-cyclohexyl-5-methylphenol],4,4'-[(3,4-dihydroxyphenyl)methylene]bis[2-methylphenol],4,4'-[(3,4-dihydroxyphenyl)methylene]bis[2,6-dimethylphenol],4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4'-[(2-hydroxyphenyl)methylene]bis[3-methylphenol], 1,3,3-tris(4-hydroxyphenyl)butane,4,4'-[(2-hydroxyphenyl)methylene]bis[2-isopropylphenol],4,4'-[(3-hydroxyphenyl)methylene]bis[2-isopropylphenol],4,4'-[(4-hydroxyphenyl)methylene]bis[2-isopropylphenol],2,2'-[(3-hydroxyphenyl)methylene]bis[3,5,6-trimethylphenol],2,2'-[(4-hydroxyphenyl)methylene]bis[3,5,6-trimethylphenol],4,4'-[(2-hydroxyphenyl)methylene]bis[2-cyclohexylphenol],4,4'-[(3-hydroxyphenyl)methylene]bis[2-cyclohexylphenol], 4,4'-[1-[4-[1-(4-hydroxy-3,5-dimethylphenyl)-1-methylethyl]phenyl]ethylidene]bis[2,6-dimethylphenol],4,4',4''-methylidinetris[2-cyclohexyl-5-methylphenol],4,4'-[1-[4-[1-(3-cyclohexyl-4-hydroxyphenyl)-1-methylethyl]phenyl]ethylidene]bis[2-cyclohexylphenol],2,2'-[(3,4-dihydroxyphenyl)methylene]bis[3,5-dimethylphenol], 4,4'-[(3,4-dihydroxyphenyl)methylene]bis[2-isopropylphenol], 2,2'-[3,4-dihydroxyphenyl)methylene]bis[3,5,6-trimethylphenyl], 4,4'-[(3,4-dihydroxyphenyl)methylene]bis[2-cyclohexylphenol] and α, α', α''-tris(4-hydroxyphenyl)-1,3,5-triisopropylbenzene.

The adhesive to be used in the adhesive film of this invention contains preferably 1 to 100 parts by weight, more preferably 2 to 50 parts by weight of the epoxy resin and preferably 0.02 to 120 parts by weight, more preferably 0.1 to 80 parts by weight, further preferably 1 to 20 parts by weight of the epoxy resin-curing agent, both relative to 100 parts by weight of the heat resistant thermoplastic resin.

If more than 100 parts by weight of the epoxy resin and more than 120 parts by weight of the epoxy resin-curing agent are used, film formability may be aggravated. If less than 1 parts by weight of the epoxy resin and less than 0.02 parts by weight of the epoxy resin-curing agent are used, bonding failure may occur due to aggravated low temperature adhesive property.

The adhesive to be used in the adhesive film of this invention may optionally contain cure accelerators, which may be any one commonly used to cure epoxy resins. Examples include imidazoles, dicyanediamide derivatives, dicarboxylic acid dihydrazides, triphenylphosphine, tetraphenylphosphonium tetraborate, 2-ethyl-4-methylimidazole tetraphenylborate and 1,8-diazabicyclo(5,4,0)undecene-7-tetraphenylborate. These may be used individually or in combination of two or more. In view of storage stability, the amount of the cure accelerators used, if any, is generally 50 parts by weight or less, for example, 0.01 to 50 parts by weight, preferably 20 parts by weight or less, relative to 100 parts by weight of the epoxy resin.

To improve adhesion to the support film, coupling agents may be added to the adhesive to be used in the adhesive film of this invention, for example silane coupling agents, such as γ-(2-aminoethyl)aminopropyltrimethoxysilane, γ-(2-aminoethyl)aminopropylmethyldimethoxysilane, aminosilane, γ-methacryloxypropyltrimethoxysilane, γ-glycidoxypropyltrimethoxysilane, methyltrimethoxysilane, methyltriethoxysilane, vinyltriacetoxysilane, hexamethyldisilazane, γ-anilinopropyltrimethoxysilane and vinyltrimethoxysilane, titanate coupling agents, such as isopropyl triisostearoyl titanate, isopropyl trioctanoyl titanate, isopropyl tridodecylbenzenesulfonyl titanate and isopropyl tris(dioctylpyrophosphate) titanate, and aluminum coupling agents, such as acetalkoxyaluminum diisopropylate.

In view of heat resistance and adhesion to lead frames, the amount of the coupling agents added is preferably 0.5 to 20 parts by weight, more preferably 2 to 10 parts by weight, relative to 100 parts by weight of the heat resistant thermoplastic resin.

The support film to be used in this invention is preferably an insulating heat resistant resin film, such as polyimides, polyamides, polysulfones, polyphenylenesulfides, polyetheretherketones, polyallyrates and polycarbonates. The thickness of the support film is not particularly limited, and in general, it is preferably 5 to 200 μm, more preferably 20 to 75 μm.

It is desirable to use support films having glass transition temperatures higher than the adhesive to be used in this invention, preferably 200° C. or higher, more preferably 250° C. or higher. The support film preferably has a water absorption of 3% by weight or less, more preferably 2% by weight or less.

The support film to be used in this invention is preferably an insulating heat resistant resin film having a glass transition temperature of 250° C. or higher, a water absorption of 2% by weight or less and a thermal expansion coefficient of $3 \times 10^{-5}/°C$. or less, particularly preferably a polyimide film.

The support film preferably has surfaces treated before its use to increase the bonding strength between the support film and the adhesive layers and prevent the peeling between the support film and the adhesive layers.

The method of surface treatment for the support film may be any one, for example, a chemical treatment, such as alkali treatment or silane coupling treatment, a mechanical treatment, such as sand mat treatment, plasma treatment or corona treatment, and a treatment best adapted to the kind of adhesive used may be chosen. Chemical treatments and plasma treatment are particularly suited for treating the support film to be used in this invention.

Any method may be used to form the adhesive layers on the support film may be any one, and in general, the heat resistant thermoplastic resin, the epoxy resin and the epoxy resin-curing agent, which form the adhesive layers, are dissolved in an organic solvent to give an adhesive varnish. The solvent used may be any one, which uniformly dissolves or mixes the above-described materials, such as dimethylformamide, dimethylacetamide, N-methyl-2-pyrrolidone, dimethyl sulfoxide, diethylene glycol dimethyl ether, toluene, benzene, xylene, methyl ethyl ketone, tetrahydrofuran and dioxane.

The adhesive varnish obtained as above are applied to the support film, and then heated to remove solvents and to perform imidation. This procedure is carried out twice, to give an adhesive film of three-layer structure.

Temperatures at which solvents can be removed will suffice for heating the support film coated with the adhesive varnish to remove solvents.

Any coating method may be employed, for example, roll coating, reverse roll coating, gravure coating, bar coating and comma coating. Coating may also be performed by passing the support film through the adhesive varnish, but control of thickness will be difficult.

Each adhesive layer formed on the support film is preferably 1 to 75 $\mu$m thick, more preferably 10 to 30 $\mu$m thick. Adhesive layers thinner than 1 $\mu$m are inferior in adhesive property and productivity, and those thicker than 75 $\mu$m increase the production cost.

Thus obtained adhesive film has a structure as shown in FIG. 1. The film may be used as an adhesive for semiconductor. In FIG. 1, 1 indicates support film, and 2 indicates adhesive layer.

Highly reliable lead frames attached with adhesive film can be produced readily with high yields by using the adhesive film of this invention. For example, the adhesive film of this invention is cut into film pieces of prescribed sizes, which are then bonded to lead frames. The adhesive film may be cut by any method, so far as it may be cut into prescribed shapes accurately. In view of workability, it is preferable to use a punching die to cut the adhesive film and bond the punched film piece directly to a lead frame. The bonding temperature is generally 150 to 300° C., preferably 200 to 250° C. Bonding temperatures lower than 150° C. cannot give sufficient bonding strength, and those higher than 300° C. may thermally aggravate the adhesive layers or oxidize lead frames. Bonding pressure is generally 0.1 to 20 MPa, preferably 0.3 to 10 MPa. Bonding pressures lower than 0.1 MPa may not give sufficient bonding strength, and those higher than 20 MPa may squeeze out the adhesive from the prescribed position, lowering the dimensional accuracy. The bonding time is not limited so far as bonding can be accomplished at the above-described bonding temperatures and bonding pressures, and in view of efficiency, it is preferably 0.3 to 60 seconds, more preferably 0.5 to 10 seconds.

Highly reliable semiconductor devices can be produced easily with good workability and high yields by using the adhesive film of this invention.

The adhesive film of this invention may be used in place of silver paste in packages of conventional structure using silver paste, or in multi chip packages containing plural chips and packages of COL (Chip On Lead) structure, particularly suitably in semiconductor devices of LOC (Lead On Chip) structure. Because of the ability of low temperature bonding, it is suitable for semiconductor devices of various LOC structures, including not only the conventional TSOP (Thin Small Outline Package) structure but also QFP (Quad Flatpack Package) structure and stuck structure.

For example, in cases where the lead frame with adhesive film produced as described above is used, a semiconductor devices of LOC structure can be produced by bonding a semiconductor chip to the adhesive layer on the side to which the lead frame is not bonded, curing the adhesive film, connecting the lead frame with the semiconductor chip by gold wire or the like, and then sealing them by transfer molding a molding material, such as epoxy resins.

The temperature at which semiconductor chips are bonded is generally 150 to 300° C., preferably 200 to 250° C. Bonding temperatures lower than 150° C. cannot give sufficient bonding strength, and those higher than 300° C. cause the problems of thermal degradation of adhesive layers or oxidation of lead frames. Bonding pressure is generally 0.1 to 20 MPa, preferably 0.3 to 10 MPa. Bonding pressure lower than 0.1 MPa cannot give sufficient bonding strength, and those higher than 20 MPa may squeeze out the adhesive from the prescribed positions to lower the dimensional accuracy and brake semiconductor chips.

Pressing time is not limited so far as bonding can be accomplished at the above-described bonding temperatures and bonding pressures, and in view of efficiency, it is preferably 0.3 to 60 seconds, more preferably 0.5 to 10 seconds.

Curing temperature is generally 150 to 200° C., preferably 170 to 180° C. Curing temperatures lower than 150° C. are insufficient for curing, and those higher than 200° C. may cause oxidation of lead frames. Curing time is generally 15 to 75 minutes, preferably 30 to 60 minutes. Curing times less than 15 minutes are insufficient for curing, and those longer than 75 minutes decrease the working efficiency. Alternatively, sealing material-curing step following to the sealing by transfer molding the molding material, such as epoxy resins, can double as the curing treatment for the adhesive film.

This invention will be described in more detail with reference to the following Examples, which however are not to be construed to limit the scope of the invention.

EXAMPLES 1 TO 4 AND COMPARATIVE EXAMPLE 1

The following polyamideimides A to C were used as heat resistant thermoplastic resins to prepare varnishes Nos. 1 to 5 (Nos. 1 to 4: for Examples 1 to 4 according to this invention, respectively, No. 5: for Comparative Example 1) of the compositions as shown in Tables 2 and 3.

The polyamideimides A, B and C used were synthesized as follows.

Synthesis of Polyamideimide A

Into a 5-liter four-necked flask equipped with a thermometer, a stirrer, a nitrogen inlet tube and a fractionating column was placed 210 g (0.5 moles) of 2,2-bis[4-(4-aminophenoxy)phenyl]propane in nitrogen atmosphere, and dissolved in 1200 g of N-methyl-2-pyrrolidone. The solution was cooled to −10° C., and 105.3 g (0.5 moles) of trimellitic acid monochloride was added thereto, while keeping the temperature below −5° C. After the trimellitic acid monochloride was dissolved, 76 g of triethylamine was added, while keeping the temperature below 5° C. After stirring for one hour at room temperature, reaction was carried out at 180° C. for 9 hours to complete imidation. The resulting reaction solution was poured in methanol, to separate a polymer. After drying, the polymer was dissolved in dimethylformamide, and poured into methanol to separate the polymer again. It was then dried under reduced pressure, to give a purified powdery polyamideimide A. 60 g of the powdery polyamideimide A was dissolved in 200 g of N-methyl-2-pyrrolidone, to give an adhesive varnish. The varnish was cast on a glass plate to 90 μm thick, dried at 100° C. for 10 minutes, peeled off from the glass plate, secured to an iron frame and dried at 200° C. for 10 minutes and at 300° C. for 10 minutes, to give a 25 μm thick film of an adhesive. The film had a glass transition temperature of 230° C., a water absorption of 1.8% by weight and a squeeze length of 0.2 mm.

Synthesis of Polyamideimide B

Into a 5-liter four-necked flask equipped with a thermometer, a stirrer, a nitrogen inlet tube and a fractionating column were placed 143.5 g (0.35 moles) of 2,2-bis[4-(4-aminophenoxy)phenyl]propane and 37.2 g (0.15 moles) of 1,3-bis(aminopropyl)tetramethyldisiloxane in nitrogen atmosphere, and dissolved in 1200 g of N-methyl-2-pyrrolidone. The solution was cooled to −10° C., and 105.3 g (0.5 moles) of trimellitic acid monochloride was added thereto, while keeping the temperature below −5° C. After the trimellitic acid monochloride was dissolved, 76 g of triethylamine was added, while keeping the temperature below 5° C. After stirring for one hour at room temperature, reaction was carried out at 180° C. for 9 hours to complete imidation. The resulting reaction solution was poured in methanol, to separate a polymer. After drying, the polymer was dissolved in dimethylformamide, and poured into methanol to separate the polymer again. It was then dried under reduced pressure, to give a purified powdery polyamideimide B. 60 g of the powdery polyamideimide B was dissolved in 200 g of N-methyl-2-pyrrolidone, to give an adhesive varnish. The varnish was cast on a glass plate to 90 μm thick, dried at 100° C. for 10 minutes, peeled off from the glass plate, secured to an iron frame and dried at 200° C. for 10 minutes and at 300° C. for 10 minutes, to give a 25 μm thick film of an adhesive. The film had a glass transition temperature of 190° C., a water absorption of 1.5% by weight and a squeeze length of 0.4 mm.

Synthesis of Polyamideimide C

Into a 5-liter four-necked flask equipped with a thermometer, a stirrer, a nitrogen inlet tube and a fractionating column were placed 61.5 g (0.15 moles) of 2,2-bis[4-(4-aminophenoxy)phenyl]propane and 86.8 g (0.35 moles) of 1,3-bis(aminopropyl)tetramethyldisiloxane in nitrogen atmosphere, and dissolved in 1200 g of N-methyl-2-pyrrolidone. The solution was cooled to −10° C., and 105.3 g (0.5 moles) of trimellitic acid monochloride was added thereto, while keeping the temperature below −5° C. After the trimellitic acid monochloride was dissolved, 76 g of triethylamine was added, while keeping the temperature below 5° C. After stirring for one hour at room temperature, reaction was carried out at 180° C. for 9 hours to complete imidation. The resulting reaction solution was poured in methanol, to separate a polymer. After drying, the polymer was dissolved in dimethylformamide, and poured into methanol to separate the polymer again. It was then dried under reduced pressure, to give a purified powdery polyamideimide C. 60 g of the powdery polyamideimide C was dissolved in 200 g of N-methyl-2-pyrrolidone, to give an adhesive varnish. The varnish was cast on a glass plate to 90 μm thick, dried at 100° C. for 10 minutes, peeled off from the glass plate, secured to an iron frame and dried at 200° C. for 10 minutes and at 300° C. for 10 minutes, to give a 25 μm thick film of an adhesive. The film had a glass transition temperature of 100° C., a water absorption of 1.0% by weight and a squeeze length of 3.5 mm.

TABLE 1

| Heat resistant thermoplastic resin | Glass transition temperature (° C.) | Water absorption (% by weight) | Squeeze length (mm) |
|---|---|---|---|
| Polyamideimide A | 230 | 1.8 | 0.2 |
| Polyamideimide B | 190 | 1.5 | 0.4 |
| Polyamideimide C | 100 | 1.0 | 3.5 |

The letters in Tables 2 and 3 indicate the followings.

YDCN-702: cresol novolak epoxy resin (epoxy equivalent weight: 220) produced by Tohto Kasei Kabushiki Kaisha ESCN-195: cresol novolak epoxy resin (epoxy equivalent weight: 200) produced by Sumitomo Chemical Co., Ltd.

N865-E: bisphenol novolak epoxy resin (epoxy equivalent weight: 208) produced by Dainippon Ink Chemicals, Inc.

BEO-60E: ethylene oxide-adduct bisphenol epoxy resin (epoxy equivalent weight: 373) produced by Shin-Nippon Rikagaku Kabushiki Kaisha DEM-100: cyclohexane dimethanol epoxy resin (epoxy equivalent weight: 155) produced by Shin-Nippon Rikagaku Kabushiki Kaisha TrisP-TC: trisphenol novolak (OH equivalent weight: 160) produced by Honshu Kagaku Kabushiki Kaisha, chemical name: α, α', α"-tris(4-hydroxyphenyl)-1,3,5-triisopropylbenzene; formula (a1)

TrisP-PA: trisphenol novolak (OH equivalent weight: 141) produced by Honshu Kagaku Kabushiki Kaisha, chemical name: 4,4'-[1-[4-[1-(4-hydroxyphenyl)-1-methylethyl]phenyl]ethylidene]bisphenol; formula (a2)

TrisP-PHBA: trisphenol novolak (OH equivalent weight: 97) produced by Honshu Kagaku Kabushiki Kaisha, chemical name: 4,4',4"-methylidinetrisphenol; formula (a3)

TrisP-HAP: trisphenol novolak (OH equivalent weight: 102) produced by Honshu Kagaku Kabushiki Kaisha, chemical name: 4,4',4"-ethylidinetrisphenol; formula (a4)

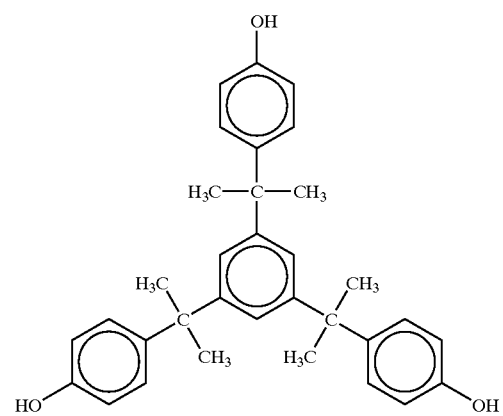

(a1)

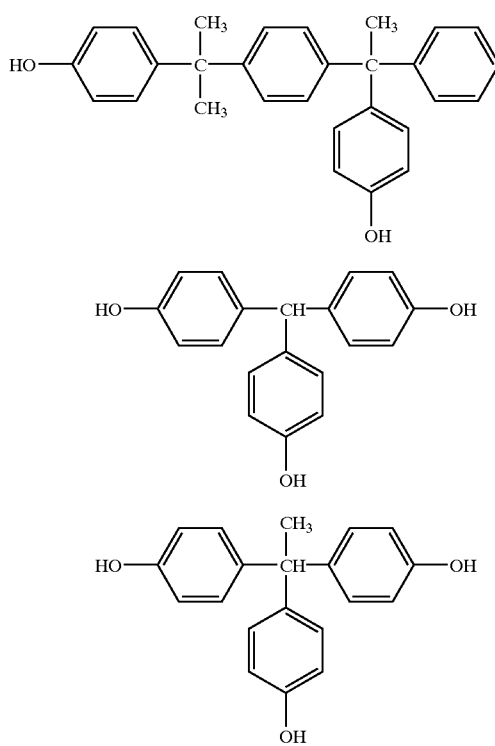

DMAc: dimethylacetamide
DMF: dimethylformamide
NMP: N-methyl-2-pyrrolidone

TABLE 2

(Composition)

| Ingredient | Varnish number | | | |
|---|---|---|---|---|
| | No. 1 | No. 2 | No. 3 | No. 4 |
| Heat resistant thermoplastic resin (wt part) | A 100 | B 100 | A 100 | B 100 |
| Epoxy resin (wt part) | YDCN-702 10 | ESCN-195 20 | N-865 25 | BEO-60E 20 |
| Epoxy resin-curing agent (wt part) | TrisP-TC 7.3 | TrisP-PA 14.1 | TrisP-PHBA 11.7 | TrisP-HAP 5.5 |
| Solvent (wt part) | DMAc 500 | NMP 350 | DMF 450 | DMAc 500 |

TABLE 3

(Composition)

| Ingredient | Varnish number No. 5 |
|---|---|
| Heat resistant thermoplastic resin (wt part) | C 100 |

TABLE 3-continued (Composition)

| Ingredient | Varnish number No. 5 |
|---|---|
| Epoxy resin (wt part) | YDCN-702 10 |
| Epoxy resin-curing agent (wt part) | TrisP-TC 7.3 |
| Solvent (wt part) | DMAc 500 |

Each of these varnishes was applied to each face of a 50 μm thick chemically surface treated polyimide film (trade name: UPILEX S, produced by Ube Industries, Ltd.) to 100 μm thick, and both sides of the film were dried separately at 100° C. for 10 minutes and 200° C. for 10 minutes, to give adhesive films for semiconductor having a 25 μm thick adhesive layer on each side as shown in FIG. 1 (Examples 1 to 4: using varnishes Nos. 1 to 4 respectively, Comparative Example 1: using varnish No. 5).

The adhesive films of Examples 1 to 4 and Comparative Example 1 were examined for film formability, adhesive property and reflow cracking resistance. The results are listed in Table 4.

The water absorption and squeeze length of the adhesive films of three-layer structure produced in Examples 1 to 4 and Comparative Example 1 were determined. The results are listed in Table 5.

Evaluation Method for Film Formability

The adhesive films produced as described above were checked for the stickiness of their adhesive layers. Non-sticky ones were rated as "good", and sticky ones as "inferior".

Evaluation Method for Low Temperature Adhesive Property

Lead frames attached with adhesive film were produced by punching out each adhesive film with a punching die into strips, which were placed on a 0.15 mm thick copper alloy lead frame to apply them to 0.2 mm wide inner leads arranged at 0.2 mm intervals, and then bonded by pressing at 250° C. for 3 seconds with a pressure of 3 MPa. The lead frames attached with adhesive film were dropped from a level 2 m high on the ground to examine for the falling off of the adhesive film strips. Adhesive films the strips of which did not fall off were rated as "good", and those the strips of which fell off were rated as "inferior".

Evaluation Method for Reflow Cracking Resistance

Figure 2:
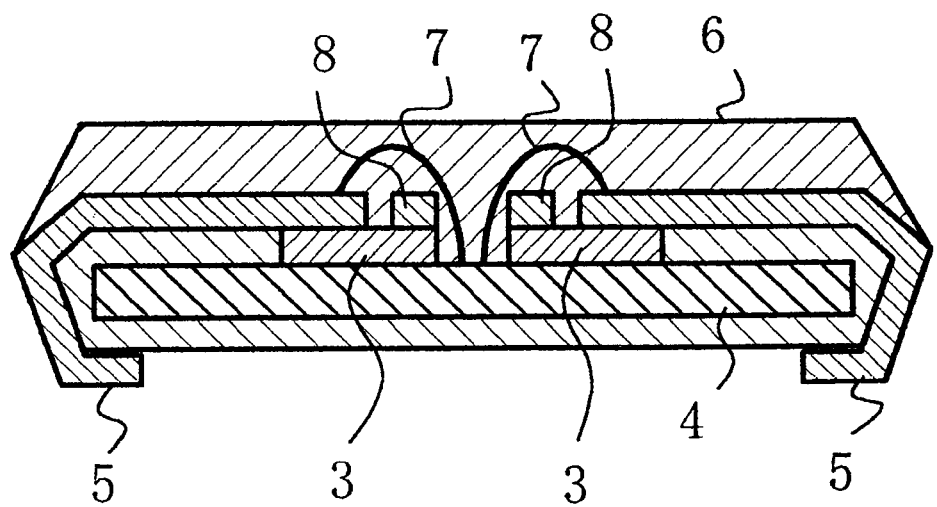
FIG. 2 is a sectional view of a semiconductor device using the adhesive film for semiconductor of this invention.

To the exposed adhesive layer of each of the lead frames attached with adhesive film that were produced for the evaluation for adhesive property, were bonded a semiconductor element by pressing at 250° C. for 3 seconds with a pressure of 3 MPa, and then the lead frame and the semiconductor element were connected by wire-bonding with gold wires and sealed by transfer molding a biphenyl epoxy resin molding material (trade name: CEL-9200, produced by Hitachi Chemical Co., Ltd.) and post-curing at 175° C. for 6 hours, to give semiconductor devices as shown in FIG. 2. In FIGS. 2, 3 indicates adhesive film, 4 indicates semiconductor element, 5 indicates lead frame, 6 indicates sealing material, 7 indicates bonding wire and 8 is bus bar.

The semiconductor devices thus obtained were allowed to stand for 168 hours in a high temperature-high humidity atmosphere of 85° C. and 85% RH, and then subjected twice to a treatment comprising passing them through an IR reflow furnace the temperature of which was controlled so that the surfaces of the semiconductor devices were kept at 240° C. for 20 seconds and cooling them by allowing to stand at room temperature. Thereafter, they were observed for the presence of cracks. Those free of cracks were rated as "good", and those cracked were rated as "inferior".

TABLE 4

Results of Evaluation for the Properties of Adhesive Films

| Properties | Example 1 | Example 2 | Example 3 | Example 4 | Comp. Example 1 |
|---|---|---|---|---|---|
| Film formability | good | good | good | good | good |
| Low temperature adhesive property | good | good | good | good | good |
| Reflow cracking resistance | good | good | good | good | inferior |

TABLE 5

Water Absorption and Squeeze Length of Adhesive Film of Three-Layer Structure (support film: 100 μm, adhesive layer: 25 μm each)

| | Water Absorption of Adhesive Film (wt %) | Squeeze Length of Adhesive Film (mm) |
|---|---|---|
| Example 1 | 1.8 | 0.3 |
| Example 2 | 1.7 | 0.4 |
| Example 3 | 1.8 | 0.3 |
| Example 4 | 1.7 | 0.5 |
| Comp. Example 1 | 1.4 | 3.8 |

Examples 1 to 4 possessed the elements required by this invention, and were excellent in film formability, low temperature adhesive property and reflow cracking resistance.

Comparative Example 1 did not satisfy the Tg and squeeze length of the heat resistant thermoplastic resin required by this invention, and was inferior in reflow cracking resistance.

Industrial Applicability

The adhesive film for semiconductor of this invention can be bonded at low temperatures, and is particularly useful for the production of lead frames attached with adhesive film using copper lead frames. Semiconductor devices produced by using the lead frames attached with adhesive film have excellent reflow cracking resistance and high reliability.

What is claimed is:

1. An adhesive film for semiconductor, which has a three-layer structure consisting of a support film having each face coated with an adhesive layer, each adhesive layer containing (A) a heat resistant thermoplastic resin having a glass transition temperature of 130 to 300° C., a water absorption of 3% by weight or less and a squeeze length of 2 mm or less, (B) an epoxy resin and (C) a trisphenol compound as an epoxy resin-curing agent.

2. The adhesive film for semiconductor of claim 1, wherein each adhesive layer contains 100 parts by weight of the heat resistant thermoplastic resin (A), 1 to 100 parts by weight of the epoxy resin (B) and 0.02 to 120 parts by weight of the epoxy resin-curing agent (C).

3. The adhesive film for semiconductor of claim 1, wherein the heat resistant thermoplastic resin (A) is a polyimide resin, a polyamideimide resin, a polyesterimide resin, a polyetherimide resin or a polyamide resin.

4. The adhesive film for semiconductor of claim 3, wherein the heat resistant thermoplastic resin (A) is a polyamideimide resin or a polyamide resin.

5. A lead frame with adhesive film for semiconductor, comprising a lead frame and the adhesive film for semiconductor of claim 4 stuck to the lead frame.

6. A semiconductor device, containing a lead frame and a semiconductor element which are bonded to each other with the adhesive film for semiconductor of claim 4.

7. The adhesive film for semiconductor of claim 1, wherein the epoxy resin-curing agent (C) is a trisphenol compound represented by the following general formula (a):

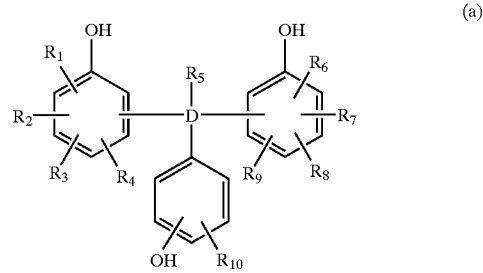

(a)

wherein $R_1$ to $R_{10}$ are each independently hydrogen, an alkyl group of 1 to 10 carbon atoms, a cycloalkyl group of 5 to 10 carbon atoms, phenyl group or hydroxyl group, and D is a tetravalent organic group.

8. The adhesive film for semiconductor of claim 7, wherein D in general formula (a) is

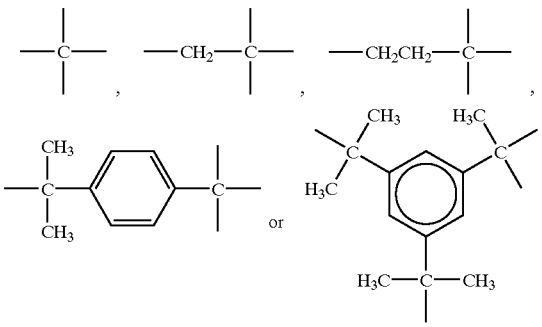

9. The adhesive film for semiconductor of claim 8, wherein $R_5$ in general formula (a) is hydrogen or an alkyl group of 1 to 10 carbon atoms.

10. The adhesive film for semiconductor of claim 9, wherein $\equiv D—R_5$ in general formula (a) is

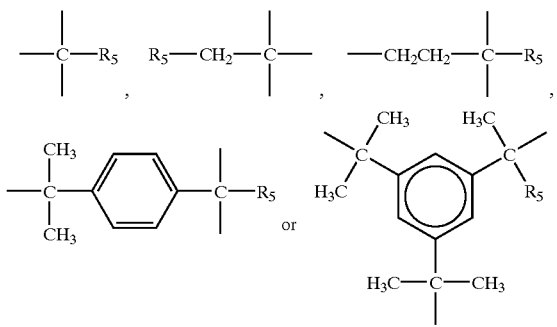

11. The adhesive film for semiconductor of claim 1, wherein the heat resistant thermoplastic resin has a glass transition temperature of 180 to 250° C., a water absorption of 2.5% by weight or less, and a squeeze length of 1 mm or less.

12. The adhesive film for semiconductor of claim 11, wherein the water absorption and squeeze length of the heat resistant thermoplastic resin are respectively 2.0% by weight or less and 0.5 mm or less.

13. The adhesive film for semiconductor of claim 1, wherein the support film is an insulating heat resistant resin film having a glass transition temperature of 250° C. or higher, a water absorption of 2% by weight or less and a thermal expansion coefficient of $3 \times 10^{-5}$/° C. or less.

14. The adhesive film for semiconductor of claim 1, wherein the support film is an insulating heat resistant resin selected from the group consisting of a polyimide, a polyamide, a polysulfone, a polyphenylene sulfide, a polyetheretherketone, a polyallylate and a polycarbonate.

15. A lead frame with adhesive film for semiconductor, comprising a lead frame and the adhesive film for semiconductor of claim 1 stuck to the lead frame.

16. A semiconductor device, containing a lead frame and a semiconductor element which are bonded to each other with the adhesive film for semiconductor of claim 1.

17. An adhesive film for semiconductor, which has a three-layer structure consisting of a support film having each face coated with an adhesive layer, each adhesive layer containing (A) a heat resistant thermoplastic resin having a glass transition temperature of 130 to 300° C., (B) an epoxy resin and (C) a trisphenol compound as an epoxy resin-curing agent, wherein the adhesive film having the three-layer structure has a water absorption of 3% by weight or less and a squeeze length of 2 mm or less.

18. The adhesive film for semiconductor of claim 16, wherein the adhesive film has a water absorption of 2.5% by weight or less and a squeeze length of 1 mm or less.

19. The adhesive film for semiconductor of claim 18, wherein the water absorption and squeeze length of the adhesive film are respectively 2.0% by weight or less and 0.5 mm or less.

20. The adhesive film for semiconductor of claim 17, wherein the heat resistant thermoplastic resin (A) is a polyimide resin, a polyamideimide resin, a polyesterimide resin, a polyetherimide resin or a polyamide resin.

21. The adhesive film for semiconductor of claim 20, wherein the heat resistant thermoplastic resin (A) is a polyamideimide resin or a polyamide resin.

22. A lead frame with adhesive film for semiconductor, comprising a lead frame and the adhesive film for semiconductor of claim 17 stuck to the lead frame.

23. A lead frame with adhesive film for semiconductor, comprising a lead frame and the adhesive film for semiconductor of claim 22 stuck to the lead frame.

24. A semiconductor device, containing a lead frame and a semiconductor element which are bonded to each other with the adhesive film for semiconductor of claim 22.

25. A semiconductor device, containing a lead frame and a semiconductor element which are bonded to each other with the adhesive film for semiconductor of claim 17.

* * * * *